United States Patent [19]

Schmitt et al.

[11] 4,332,627

[45] Jun. 1, 1982

[54] METHOD OF ELIMINATING LATTICE DEFECTS IN A SEMICONDUCTOR DEVICE

[75] Inventors: Alfred Schmitt, Boeblingen; Gerd Schorer, Herrenberg, both of Fed. Rep. of Germany

[73] Assignee: International Business Machines Corporation, Armonk, N.Y.

[21] Appl. No.: 140,270

[22] Filed: Apr. 14, 1980

[30] Foreign Application Priority Data

Apr. 30, 1979 [DE] Fed. Rep. of Germany ....... 2917455

[51] Int. Cl.³ ..................... H01L 21/265; H01L 3/14; B01J 17/00
[52] U.S. Cl. .................................... 148/1.5; 148/186; 148/187; 357/13; 357/91
[58] Field of Search ........................ 148/1.5, 187, 186; 357/13, 91

[56] References Cited

U.S. PATENT DOCUMENTS

| | | | |
|---|---|---|---|
| 3,793,093 | 2/1974 | Nishizawa et al. | 148/186 |
| 3,812,519 | 5/1974 | Nakamura et al. | 317/234 R |
| 3,834,953 | 9/1974 | Nakamura et al. | 148/186 |
| 3,852,119 | 12/1974 | Gosney et al. | 148/1.5 |
| 4,060,427 | 11/1977 | Barile et al. | 148/1.5 |
| 4,118,250 | 10/1978 | Horng et al. | 148/1.5 |
| 4,135,292 | 1/1979 | Jaffe et al. | 29/578 |
| 4,144,100 | 3/1979 | MacIver | 148/1.5 |

FOREIGN PATENT DOCUMENTS

2356277 1/1978 France.
53-108379 9/1978 Japan.

OTHER PUBLICATIONS

Yonezewa et al. in Semiconductor Silicon, 1977 ed., Huff et al., The Electrochem. Soc., Princeton, N.J., pp. 658-675.
Aggarwal, IBM-TDB, 19 (1976) 162.
Edel et al., IBM-TDB, 13 (1970) 632.
Kirchner, Jour. Appl. Phys. 46 (1975) 2167.
Neues Aus Der Technik, 3 (1978) Zusammenfassung #465.
Dinklage et al., IBM-TDB, 19 (1977) 4091.

*Primary Examiner*—Upendra Roy
*Attorney, Agent, or Firm*—Joseph C. Redmond, Jr.; Theodore E. Galanthay

[57] ABSTRACT

The invention relates to a semiconductor device and to a method of fully eliminating lattice defects in N-conductive zones of a semiconductor device which are generated by ion implantation of phosphorus. According to the invention, conductivity-determining ions like antimony or arsenic are implanted into phosphorus-doped zones of a semi-conductor device. A dosage of 1 to 10% of the phosphorus dose is used. The implantation of the antimony or arsenic takes place with the same, or with a greater implantation depth than the phosphorus depth. Subsequent to the antimony/arsenic implantation the device is annealed in an inert gas atmosphere at approximately 1000° C.

6 Claims, 5 Drawing Figures

METHOD OF ELIMINATING LATTICE DEFECTS IN A SEMICONDUCTOR DEVICE

BACKGROUND OF THE INVENTION

The invention relates to a method for fully eliminating lattice defects in N-conductive zones of a semiconductor device which are generated by ion implantation of phosphorus and to an associated semiconductor device.

It is known that the implantation of impurities in a silicon lattice causes dislocations. Owing to these dislocations, leakage currents in silicon semiconductor devices are increased considerably, particularly in integrated circuits consisting of this material. In the article "Strain Compensation in Silicon by Diffused Impurities" by T. H. Yeh et al., J. Electrochem. Soc.: Solid State Science, January 1969, pp. 73 the introduction of impurities in silicon by means of thermal diffusion is discussed. It is concluded that during the diffusion of boron or phosphorus, whose atomic radii substantially differ from those of silicon, strains are produced which cause dislocations. Yeh et al. arrived at the conclusion that tin or germanium atoms, whose atomic radii are greater than that of the silicon, can compensate for strains in the silicon which are caused by thermally diffused boron or phosphorus, whose atomic radii are much smaller than that of the silicon.

It is also known that after the introduction of conductivity-determining ions at a dose on the order of $10^{14}/cm^2$ in silicon by means of ion implantation and subsequent annealing, defects are formed in the crystal lattice. The density of these defects can be decreased by a double implantation and a subsequent thermal processing. An article by N. Yoshihiro et al., "High Dose Phosphorus-Germanium Double Implantation in Silicon", Proceedings of the 4th International Conference of Ion Implantation, 1975, pages 572-576 disclosed that the defect density can be reduced when phosphorus and germanium ions are implanted in the silicon in a double implantation. The best results were obtained using a first annealing step in wet oxygen at 800° C., and then a second annealing step in nitrogen at 1100° C. The article indicates that the germanium dose has to amount to at least 25% of the phosphorus dose.

A disadvantage of the above described method is that germanium is unfavorable for ion implantation because, due to low isotope abundance, low ion current densities are obtained. This effect is of particular importance when germanium is used at the above mentioned high dosage. Double annealing is a complicated process, and the oxidation taking place in the first step can affect other areas of the semiconductor component. The high temperature of 1100° C. used in the second step is disadvantageous because of the simultaneous diffusion of the phosphorus. The control of the ion profile at such temperatures is no longer determined by ion implantation parameters but exclusively by diffusion processes.

It is also known, as shown in U.S. Pat. No. 4,111,719 to S. R. Mader et al. that in spite of the similar atomic radii of arsenic and silicon, dislocations are generated in the crystal lattice during the ion implantation of arsenic into silicon. These dislocations can be considerably reduced by implanting germanium into the arsenic-doped silicon.

It can be concluded that it is known that the density of the defects in arsenic or phosphorus-doped areas of silicon which are formed during the diffusion or implantation of conductivity-determining ions can be reduced by implanting non-conductivity-determining ions, e.g. tin or germanium, and by subsequent annealing. The nonconductivity-determining ions, however, have to be implanted in a relatively high concentration to ensure crystal lattice compensation and a reduction of the resulting lattice strains.

It is the object of the present invention to fully eliminate the lattice defects in phosphorus doped areas of silicon which lattice defects have a highly negative influence on the effect of integrated circuits.

Another object of the invention is to provide a method of the above specified type which is characterized in that conductivity-determining ions are implanted additionally into the phosphorus-doped zones.

SUMMARY OF THE INVENTION

Surprisingly it has been found that a double implantation, wherein antimony or arsenic is implanted at a suitable depth in phosphorus-implanted zones followed by annealing, the defects caused during implantation in silicon can be fully eliminated, even for phosphorus doses of up to $5 \times 10^{15}/cm^2$. It was originally assumed that this double implantation was effective through a reduction of the lattice strains, but now this appears less probable. Owing to the size of the atomic radii of antimony (0.136 nm) and arsenic (approximately 0.116 nm) compared with phosphorus (0.110 nm) and silicon (0.117 nm) the antimony and arsenic dose would have to amount to 40% approximately of the phosphorus dose to compensate lattice strains. According to the present invention however, an antimony or arsenic dose of only 1 to 10% of the phosphorus dose is sufficient to provide for the full elimination of the lattice defects. Normally, it would be expected that compensation of lattice strain would occur only if antimony or arsenic and phosphorus occur throughout the doped area in a suitable concentration ratio. Owing to the strongly differing diffusion coefficients during the subsequent annealing step this condition is not satisfied, and it has been determined that it is not necessary.

In practical use, phosphorus is frequently employed in silicon as a conductivity-determining ion. Due to its high diffusion coefficient and its high solubility, phosphorus is particularly suitable for making subcollector connections, base and emitter zones in integrated semiconductor devices. Doping with phosphorus is, moreover, less complex than doping with arsenic, which is generally executed in the form of a capsule diffusion. A disadvantage, however, is that with a relatively low implantation dosage for phosphorus of $5 \times 10^{14}/cm^2$ numerous defects appear in the silicon lattice which cannot be eliminated in a subsequent thermal annealing step. With a higher implantation dosage of $5 \times 10^{15}/cm^2$, at an energy of 50 keV transmission electron micrographs also show high defect densities, after annealing, as was to be expected.

The method disclosed by the invention permits making N-doped high quality, defect-free silicon through the implantation of phosphorus. For that purpose, antimony or arsenic are implanted in the same areas before and/or after the phosphorus implantation. An essential feature in making defect-free phosphorus-implanted silicon is that the silicon is made amorphous to a sufficient depth prior to the annealing following the implantation. The silicon is made amorphous by the implantation of antimony or arsenic which are preferably implanted into the silicon substrate to the same depth, or deeper than phosphorus. It is thus made sure that the defects caused by the phosphorus implantation, and also the major part of the phosphorus doping itself, are in the area that has been made amorphous.

In the double implantation according to the invention using antimony, the antimony is implanted with a dose of from about $5 \times 10^{13}$ to about $1 \times 10^{15}$ ions/cm$^2$ and an energy of at least about 100 keV, preferably at least about 140 keV. Into the same areas phorphorus is implanted with a dose of from about $1 \times 10^{14}$ to about $1 \times 10^{16}$ ions/cm$^2$ and a low energy of from about 25 to about 50 keV. Both implantations are carried out at room temperature. Maintaining a specific antimony dose is unimportant so long as the silicon substrate is rendered amorphous. The upper limit for the antimony dose is reached at $1 \times 10^{15}$ ions/cm$^2$ because with this dose the solubility limit of the antimony in silicon is exceeded, and segregations in the silicon lattice occur during annealing. The implantation energy is selected so that the antimony is implanted into the silicon at an equal or greater depth than the phosphorus. The defects are not fully eliminated when the implantation depth of the antimony is less than that of the phosphorus.

If instead of antimony, arsenic is implanted into the silicon substrate this implantation is performed with an energy of at least about 80 keV, preferably at least about 120 keV and with a dose of from about $2 \times 10^{14}$ ions/cm$^2$ to about $1 \times 10^{15}$ ions/cm$^2$. All given values apply to the implantation at room temperature. If implantation takes place at lower temperatures, such as at the temperature of liquid nitrogen, the minimum antimony or arsenic doses required are much smaller than those given above.

Following the double implantation there is an annealing step at a temperature of at least about 900° C. in an inert gas atmosphere. Subsequently, as shown by several micrographs made with the transmission electron microscope, a silicon absolutely free of defects is obtained. In this annealing process, the phosphorus penetrates to the necessary doping depth. An oxidation of the annealed areas provides an oxide of maximum uniformity.

BRIEF DESCRIPTION OF THE DRAWINGS

The method as disclosed by the invention is suitable for making NPN and PNP transistor structures. Embodiments will be described below by reference to FIGS. 1A to 1C and 2A to 2B.

The figures show the following.

DESCRIPTION OF THE INVENTION

Figure 1A:
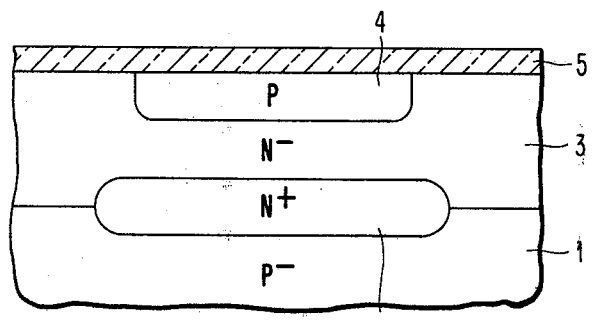
FIGS. 1A to 1C show schematic cross-sections of parts of an integrated circuit (vertical NPN transistor) in various phases of production.

The process steps utilized for making the structure of FIG. 1A are conventional and comprise masking, doping (diffusion or ion implantation), and coating steps. In this process, the buried N+ layer 2 (subcollector), the N− epitaxial layer 3 on silicon substrate 1, the doped base 4 of the transistor, and a dielectric layer 5 are formed. Silicon substrate 1 is of the P-conductivity type. Dielectric layer 5 having a thickness of 50 to 500 nm can consist of silicon dioxide which is made in a known manner by means of thermal oxidation. It is also possible to use other materials, such as silicon nitride, aluminum oxide, or silicon oxynitride which are deposited by means of cathode sputtering, or by chemical vapor deposition.

Figure 1B:
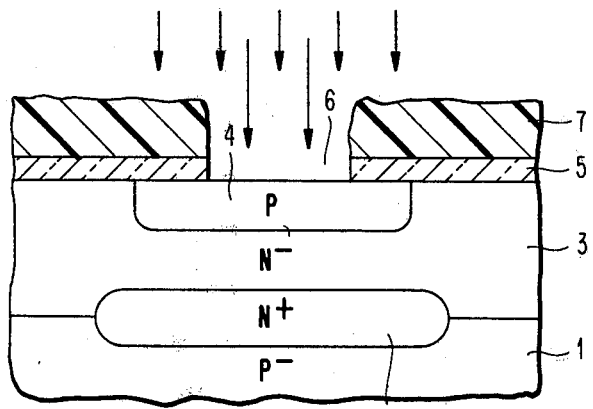

In dielectric layer 5 an emitter contact opening 6 is made in a known manner by means of photolithography (FIG. 1B). Through this emitter contact opening 6, antimony and phosphorous are implanted into base 4 of the transistor, if necessary by using a photoresist mask 7. As an example, for antimony, the ion beam is directed onto the substrate with a dose of $1 \times 10^{14}$ ions/cm$^2$ and with an energy of 200 keV, and for phosphorus with a dose of $5 \times 10^{15}$ ions/cm$^2$ and with an energy of 25 keV. The energies are selected in such a manner that the ions penetrate into base 4 to a depth of about 100 nm. The implantation energy for antimony is selected in such a manner that the antimony is implanted in base 4 deeper than phosphorus, or at least at the same depth.

In the next step, the device is annealed for about 5 minutes in an oxygen atmosphere, and for 100 minutes in a nitrogen atmosphere at a temperature of 1000° C. During this annealing process, emitter 8 (FIG. 1C) penetrates into base 4 and at the same time implantation defects are eliminated.

The NPN-transistor is thus completed. Areas 4 and 8 (FIG. 1C) can of course also be used separately as a P/N diode.

Figure 2A:
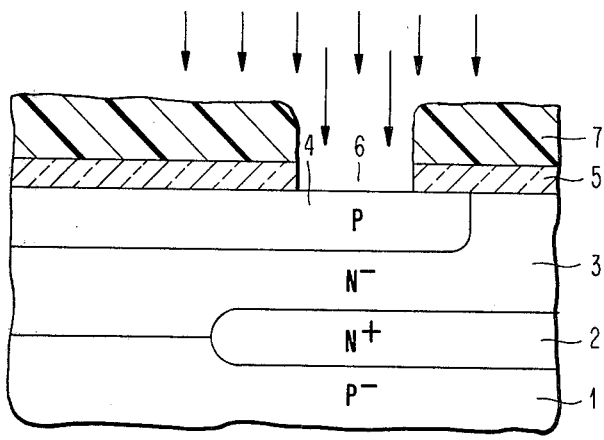
FIGS. 2A to 2B show schematic cross-sections of parts of an integrated circuit (lateral PNP transistor with high current amplification) in various phases of production.
Figure 2B:
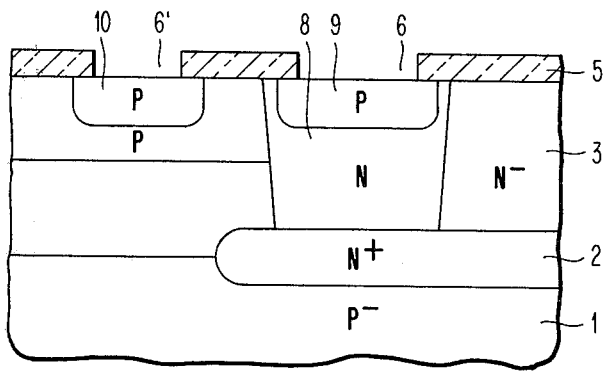

According to FIGS. 2A and 2B, the method as disclosed by the invention can also be applied for making a PNP transistor with high current amplification. By means of conventional methods, a structure is formed of a buried N+ layer 2 (sub-collector), an N− epitaxy 3 on a silicon substrate 1, a P-doped area 4 and a dielectric layer 5.

According to FIG. 2A, contact opening 6 in dielectric layer 5 is made by means of photolithography. Through this contact opening antimony and phosphorus are implanted, if necessary by using a photoresist mask 7. As an example, for antimony, the ion beam is directed onto the substrate with a dose of $1 \times 10^{14}$ ions/cm$^2$ and with an energy of 200 keV, and for phosphorus with a dose of $2 \times 10^{15}$ ions/cm$^2$ and with an energy of 50 keV.

In the next step, the device is annealed for about 5 minutes in an oxygen atmosphere, and for 100 minutes in a nitrogen atmosphere at a temperature of 1000° C. In this process, the phosphorus-doped base 8 penetrates down to a depth such that it reaches subcollector 2 (FIG. 2B). Finally, P-conductive zones, emitter 9, and collector 10 of the lateral PNP transistor are, by means of known methods, diffused or implanted simultaneously through contact holes 6 and 6' by means of known methods.

Figure 1C:
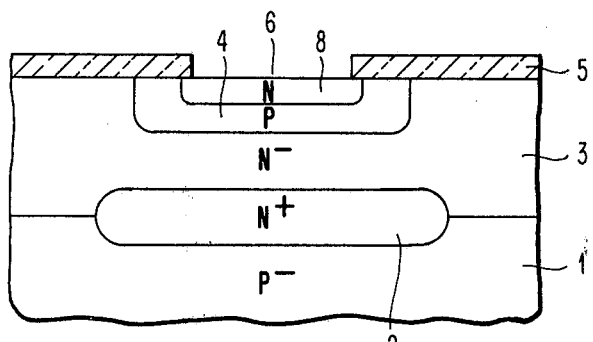

If the implantation step with antimony ions in accordance with FIGS. 1B and 2A is omitted the phosphorus-doped zones 8 in FIGS. 1C and 2D show a considerable number of defects in the silicon crystal which cannot be eliminated, even by annealing steps at temperatures of up to 1100° C. However, if as described above a double implantation of phosphorus and antimony is carried out, a silicon crystal without any defects is obtained even after annealing at approximately 1000° C. in a nitrogen atmosphere, even if phosphorus is implanted with a high dose of up to $1 \times 10^{16}$ ions/cm$^2$. The advantage of the double implantation of phosphorus and antimony is obvious from transmission electron micrographs and from electric measurements showing clearly reduced leakage currents.

Phosphorus implantation can produce N-conductive zones in the silicon which are without any defects if, as described in the invention, there is an additional implantation of antimony or arsenic, and subsequently an annealing step. It is possible by means of the method of the invention and by a subsequent reoxidation step to make N-doped zones without any defects in the semiconductor device if before or after the phosphorus implantation there is an antimony or arsenic implantation to a corresponding implantation depth. Without this double implantation and subsequent annealing, the defect density in the silicon is high.

Having thus described our invention, what we claim as new, and desire to secure by Letters Patent is:

1. Method of making defect-free phosphorus implanted zones in a silicon monocrystalline substrate comprising:
   implanting phosphorus ions in said zones of said substrate;
   implanting ions selected from the group consisting of antimony and arsenic in said zones with about the same or a greater implantation depth than the phosphorus ions to cause the silicon in said zones to become amorphous whereby the defects caused by the phosphorus implantation are included in the amorphous silicon material, and
   annealing the structure after said implantations have been performed to cause said zones of amorphous silicon to be converted to defect-free monocrystalline silicon.

2. Method of making defect-free phosphorus implanted zones in a silicon monocrystalline substrate comprising:
   implanting ions selected from the group consisting of antimony and arsenic in said zones to cause the silicon in said zones to become amorphous;
   implanting phosphorus in said zones with about the same or a lesser implantation depth than the antimony or arsenic ions whereby the defects caused by the phosphorus implantation are included in the amphorous silicon material, and
   annealing the structure after said implantations have been performed to cause said zones of amorphous silicon to be converted to defect-free monocrystalline silicon.

3. A method in accordance with claims 1 or 2 wherein said antimony or arsenic ions are implanted at a dose of from about 1 to about 10% of the phosphorus dose.

4. A method in accordance with claim 3 wherein the ion implantation of phosphorus and antimony or arsenic ions take place at ambient temperature.

5. A method in accordance with claim 4 wherein antimony is implanted into the silicon substrate at a dose of from about $5 \times 10^{13}$ to about $1 \times 10^{15}$ ions/cm$^2$ and with an energy of at least 100 keV and the phosphorus implantation is effected with a dose of from about $1 \times 10^{14}$ to about $1 \times 10^{16}$ ions/cm$^2$ and with an energy of at least about 15 keV.

6. A method in accordance with claims 1 or 2 wherein said annealing is performed at a temperature of up to 1100° C. in an inert gas atmosphere.

* * * * *